US010546795B2

(12) United States Patent
Donzel et al.

(10) Patent No.: US 10,546,795 B2
(45) Date of Patent: Jan. 28, 2020

(54) POWER SEMICONDUCTOR DEVICE AND METHOD FOR PRODUCING A POWER SEMICONDUCTOR DEVICE

(71) Applicant: ABB Schweiz AG, Baden (CH)

(72) Inventors: Lise Donzel, Wettingen (CH); Juergen Schuderer, Zürich (CH); Jagoda Dobrzynska, Lenzburg (CH); Jan Vobecky, Lenzburg (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/971,262

(22) Filed: May 4, 2018

(65) Prior Publication Data

US 2018/0254233 A1    Sep. 6, 2018

Related U.S. Application Data

(63) Continuation of application No. PCT/EP2016/075266, filed on Oct. 20, 2016.

(30) Foreign Application Priority Data

Nov. 5, 2015   (EP) .................................... 15193266

(51) Int. Cl.
  *H01L 29/06*   (2006.01)
  *H01L 23/29*   (2006.01)
  *H01L 23/31*   (2006.01)

(52) U.S. Cl.
  CPC ........ *H01L 23/3171* (2013.01); *H01L 23/293* (2013.01); *H01L 23/3185* (2013.01); *H01L 29/0615* (2013.01)

(58) Field of Classification Search
  CPC ... H01L 29/06; H01L 29/061; H01L 29/0661; H01L 29/0615; H01L 23/29;
  (Continued)

(56) References Cited

U.S. PATENT DOCUMENTS 4,388,635 A * 6/1983 Watanabe ........... H01L 29/0638
                                                    257/170
2007/0001176 A1   1/2007 Ward et al.
(Continued)

FOREIGN PATENT DOCUMENTS

DE       102004047073 B3    2/2006
EP            1394860 A2    3/2004

OTHER PUBLICATIONS

Toshiba Semiconductor Reliability Handbook, 2011.
(Continued)

*Primary Examiner* — Monica D Harrison
(74) *Attorney, Agent, or Firm* — Taft Stettinius & Hollister LLP; J. Bruce Schelkopf

(57) ABSTRACT

The present application relates to a power semiconductor device, including a substrate having a first side and a second side, the first side and the second side being located opposite to each other, wherein the first side includes a cathode and the second side includes an anode, wherein a junction termination of a p/n-junction is provided at at least one surface of the substrate, preferably at at least one of the first side and the second side, the junction termination is coated by a passivating coating, the passivating coating including at least one material selected from the group consisting of an inorganic-organic composite material, parylene, and a phenol resin comprising polymeric particles. A device as described above thus addresses issues of passivation of junction terminations and thus prevents or at least reduces the danger of fatal defects such as unstable device operation caused by changes in film properties, instability, water permeability, permeability of movable ions such as sodium, pinholes and cracks, and aluminum metal disconnection or corrosion due to degradation and stress.

20 Claims, 1 Drawing Sheet

(58) Field of Classification Search
CPC ..... H01L 23/293; H01L 23/31; H01L 23/317; H01L 23/3171; H01L 23/318; H01L 23/3185
USPC .................................................. 257/288, 788
See application file for complete search history.

(56) References Cited

U.S. PATENT DOCUMENTS

2007/0096081 A1* 5/2007 Sugawara .............. C08G 77/44
257/40
2009/0159875 A1* 6/2009 Chabinyc .......... H01L 27/14692
257/40

OTHER PUBLICATIONS

David W. Tong et al., Interface effects of SIPOS passivation, IEEE transactions on Electron Devices, vol. 33, 1986.

G. Mitic et al., IGBT module technology with high partial discharge resistance, Proceedings of the 36th IAS meeting, Chicago, 2001, vol. 3 pp. 1899-1904.

K.H. Haas, K. Rose, "Hybrid Inorganic/Organic Polymer with Nanoscale Building Blocks". 2003. Fraunhofer-Institut for Silicatforschung, Wurzburg, Germany.

K.H. Haas, S. Amberg-Schwab, K Rose, "Functionalized coating materials based on inorganic-organic polymers". 1999. Fraunhofer-Institut for Silicafforschung, Wurzburg, Germany.

International Searching Authority, "International Search Report & Written Opinion of the International Searching Authority", dated Aug. 3, 2017, 16 Pages. European Patent Office, Munich, Germany.

International Bureau of WIPO, "International Preliminary Report on Patentability", dated May 8, 2018, 12 Pages. International Bureau of WIPO, Geneva, Switzerland.

* cited by examiner

POWER SEMICONDUCTOR DEVICE AND METHOD FOR PRODUCING A POWER SEMICONDUCTOR DEVICE

TECHNICAL FIELD

The Invention relates to a power semiconductor device and to a method of producing a power semiconductor device. Such a power semiconductor device provides an improved coating of a junction termination.

BACKGROUND ART

Power semiconductor devices, such as bipolar power semiconductors, for example diodes, thyristors, gate turn-off thyristors (GTOs) and gate controlled thyristors (GCTs), may be produced from silicon wafers. After a production step in which the silicon wafers were subject to different processes, such as an implantation process, a diffusion process, a photolithographic process and a metallization process, the silicon wafers are formed such as cut to circular discs, and a first or upper bevel and a second or lower bevel are ground on the high-voltage blocking p/n-junction(s). These bevels usually require a protection by means of an electric passivation.

Issues of passivation often represent and thus act against fatal defects such as unstable device operation caused by changes in film properties, instability, water permeability, permeability of movable ions such as sodium, pinholes and cracks, and aluminium metal disconnection or corrosion due to degradation and stress. This is for example described in the Toshiba Semiconductor Reliability Handbook, 2011 and shows the importance of respective passivating coatings.

For example, with regard to BiMOS chips, a typical passivation stack for high voltage BiMOS semiconductor devices may firstly be based on a material layer adapted to saturate dangling bonds and to drain trapped charges. A respective coating may for example be formed from semi-insulating polycrystalline silicon (SIPOS) doped amorphous silicon ($\alpha$-Si), and silicon nitride (SiN). Secondly typical passivations are based on an ion barrier material layer which may be silicon nitride ($Si_3N_4$) and thirdly on a layer of polyimide as mechanical protection. SIPOS is typically deposited by LPCVD using a mixture of $SiH_4$ and $N_2O$ with a $N_2$ carrier at a temperature of 625° C. followed by annealing at 900° C. for 30 minutes. A typical sheet resistance for SIPOS is in the order of 1E12 Ohm/Sq.

With regard to bipolar discretes, one of the known passivation materials is amorphous hydrogenated carbon (a-C:H, also known as diamond-like carbon, DLC) which can be deposited in a PECVD process inside a parallel plate plasma reactor.

Regarding devices based on silicon carbide (SiC), an important design feature for passivating coatings of such devices is to find a passivation that can provide a defect-free interface to the silicon carbide base material. Approaches are made by $SiO_2$ and $Si_3N_4$ materials. For low voltage designs, there are typically no charge drainage layers. David W. Tong et al., "Interface effects of SIPOS passivation", IEEE transactions on Electron Devices, Vol. 33, 1986, describes the effects of passivating silicon wafers with semi-insulating polycrystalline silicon (SIPOS).

Document U.S. Pat. No. 8,541,317 B2 describes a method for applying a double-sided deposition of amorphous hydrogenated carbon as a-C:H-layers onto a silicon wafer. The wafer includes a first main side having a first bevel on a border of the first main side, and a second main side having a central area and a second bevel on a border of the second main side surrounding the central area. The method includes simultaneously exposing the first and second bevels to a plasma in order to create the deposition, wherein amorphous hydrogenated carbon is applied as the plasma.

Document EP 0 751 574 A2 further describes a compression-type power semiconductor device and particular a high-blocking voltage bipolar power semiconductor device. The end surface of the power semiconductor device is shaped into a positive bevel so as to relieve the electric field intensity. The silicon end surface is covered with a passivation rubber of silicone rubber.

Document U.S. Pat. No. 5,831,291 describes a semiconductor device comprising a plurality of IGBT-like cells arranged in groups on a single wafer of silicon. This document describes that a double bevel with negative bevel and positive bevel followed by etching of the bevelled surfaces and application of a dielectric coating of silastomer or resin, may be used. Alternative profiles, e.g. a double positive bevel, may be employed.

G. Mitic et al., "IGBT module technology with high partial discharge resistance", Proceedings of the 36th IAS meeting, Chicago, 2001, vol. 3 pp. 1899-1904, describe IGBT modules which have a coating made of a layer of doped amorphous silicon, i.e. a-Si:H, or further of amorphous germanium (a-Ge:H) or amorphous carbon (a-C:H) at the ceramic material of the substrates.

Document EP 2 337 070 A1 further describes an electronic device which comprises a substrate, a metal layer formed on the substrate and a field grading means located along an edge of the metal layer The field grading means has a non-linear electrical resistivity and is located on the substrate along at least one edge formed between the at least one metal layer and the insulating substrate. The filed grading means may comprise a matrix with a filer, such as a microvaristor filler, such as ZnO.

Document U.S. Pat. No. 3,628,106 describes a semiconductor device having a semiconductor crystal associated with a junction passivant in a manner to improve the electrical properties of the semiconductor device and the mechanical properties of the passivated semiconductor crystal. In detail, glass passivant layers are associated with upper and lower curved edges to protect respective junctions.

The before-described materials for coating regions of junction terminations of the power semiconductor devices, or the wafers, respectively still have room for improvements.

New coating materials are known, such coating materials, however, are used for totally different purposes which cannot be compared to coating of bevelled regions and in fact are solely used for mechanical protection.

Document US 2015/0001700 A1 describes a power module comprising a baseplate and a substrate, the substrate being an isolation material having opposing metallized sides, for example being a DBC substrate. A die is attached to the metallized top side of the substrate and the top side metallization is connected to one or more terminals by electrical connections. It is further described that a parylene coating is applied to the module. In fact, after having formed the whole module structure, the coating is applied and thus coats the corrosion-sensitive components within the module, such as the dies, the electrical connections and the metallized top side of the substrate. Therefore, parylene is not used for coating junction terminations comprising p/n-junctions.

Document US 2008/0173988 A1 describes a method for producing semiconductor chips. According to this method, especially the backside of the chips, i.e. the side which will be directed towards a substrate, is coated with Parylene. Again, parylene is not used for coating junction terminations comprising p/n-junctions.

Document US 2009/0045511 A1 describes an integrated circuit. The integrated circuit includes a substrate including a contact pad, a redistribution line coupled to the contact pad, and a dielectric material layer between the substrate and the redistribution line. The integrated circuit includes a solder ball coupled to the redistribution line and a parylene material layer sealing the dielectric material layer and the redistribution line. Again, parylene is not used for coating junction terminations comprising p/n-junctions.

In Document U.S. Pat. No. 4,126,931 and also in U.S. Pat. No. 3,684,592 a power semiconductor device is disclosed comprising a substrate having a first side and a second side, whereby the first side and the second side being located opposite to each other.

There is still room for improvements especially regarding producing power semiconductor modules and especially regarding providing a passivating coating on junction terminations having p/n-junctions, or junction terminations, respectively especially with regard to an electrical passivation.

SUMMARY OF INVENTION

It is therefore an object of the present invention to at least partly prevent at least one of the disadvantages known in the art.

In particular, it is an object of the present invention to provide a power semiconductor device which is easy and cost-saving to produce and which has a reliable passivating coating for junction terminations.

These objects are at least partly achieved by a power semiconductor device according to claim 1. These objects are further at least partly achieved by a power semiconductor module according to claim 14 and by a method according to claim 15. Preferred embodiments of the present invention are defined in the dependent claims.

The invention relates to a power semiconductor device, comprising a substrate having a first side and a second side, the first side and the second side being located opposite to each other, wherein the first side comprises a cathode and wherein the second side comprises an anode, wherein a junction termination of a p/n-junction is provided at at least one surface of the substrate, preferably at at least one of the first side and the second side, wherein the junction termination is coated by a passivating coating, the passivating coating comprising at least one material selected from the group consisting of an inorganic-organic composite material, parylene, and a phenol resin comprising polymeric particles.

Such a power semiconductor device may provide significant advantages over the power semiconductor devices as known in the prior art.

The power semiconductor device as described above may generally be any power semiconductor device. Examples for the power semiconductor device comprise inter alia bipolar devices, thyristors, BiMOS devices.

The power semiconductor device comprises a substrate having a first side and a second side, wherein the first side and the second side are located opposite to each other. For example, the first side may be arranged as an upper side, whereas the second side may be arranged as a lower side, in particular in case the power semiconductor device is arranged in a power semiconductor module.

In dependence of the arrangement of the substrate, the latter may be formed of silicon or any other suitable material, especially of any other semiconductor. For example, the power semiconductor device may comprise or may consist of silicon or gallium arsenide or it may be formed as a so-called wide bandgap semiconductor (WBG) and the latter may then comprise, or may be formed from silicon carbide, aluminium nitride, gallium nitride, and boron nitride.

With regard to the first side and the second side, the latter sides may be formed to comprise respective electrodes. With this regard, it may be provided that the first side, e.g. the upper side, comprises a cathode and that the second side, e.g. the bottom side, comprises an anode. The respective electrodes may comprise a metal contact in order to electrically connect the respective electrodes. Within the substrate, the electrodes may be formed, for example, by respective doping processes of the semiconductor as it is generally known in the art. In general, the substrate may have been subject to various different processes, such as an implantation process, a diffusion process, a photolithographic process and a metallization process, as it is known for the person skilled in the art and as it will not be described in detail here.

With this regard, it is common that the substrate, or at least one surface thereof, respectively, comprises p regions and n regions wherein respective p/n-junctions, or junction terminations, respectively, are present at at least one surface such at one or more edges of the power semiconductor device. The role of junction termination, or edge termination, respectively, is to reduce the strength of electric field approaching the surface of the semiconductor, because the electrical strength outside semiconductor has about ten times lower electrical strength than that of the bulk semiconductor, such as the bulk silicon.

Especially with regard to the surface such as edge region having a p/n-junction, where the electric field is peaking, it is provided that the junction termination is coated by a passivating coating, the passivating coating comprising at least one material selected from the group consisting of an inorganic-organic composite material, parylene, and a phenol resin comprising polymeric particles. That means that the respective junction termination, or junction termination region, is at least partly, preferably completely covered by the passivating coating.

Such a passivating coating generally has an important impact with regard to the power semiconductor device. In fact, power semiconductor's junction termination layout such as edge termination layout and its passivation are critical design features to protect the device and allow for a robust and reliable operation of the device. The role of passivation can be broadly divided as stabilization of the silicon or other semiconductor surface, i.e. termination of surface dangling bonds which would otherwise attract unwanted atoms, removal of surface charges by conducting them to a neighboring electrode, creation of sufficient insulation towards the chip exterior and thus reducing the electric field and protection from environmental factors, such as contamination, moisture, scratches, etc. Different passivation technologies may be advantageous and may be realized by the respective coating as described before.

Therefore, the passivating coating realizes both electrical protection, or passivation, and mechanical protection.

With regard to the passivating coating, it is provided that the latter comprises at least one material selected from the group consisting of an inorganic-organic composite material, parylene, and a phenol resin comprising polymeric particles. Especially these coatings have significant advantages over the coatings known from the prior art.

In general, blocking characteristics including the magnitude of leakage current of power semiconductor devices such as of thyristors having a junction termination being coated with a passivating coating of at least one of the afore-named components are at least comparable with that of existing passivation materials. This allows good electrical properties of the power semiconductor devices, or respective power semiconductor modules being equipped therewith.

Further, compared to materials as known from the prior art, significant advantages with regard to production costs may appear as the afore-named materials are at least partly easier and cheaper to manufacture and to apply to the respective regions.

Regarding a coating comprising inorganic-organic composite material, the latter describes a composite material which is formed comprising both an organic structure as well as an inorganic structure. The respective organic and inorganic structures, or building blocks, respectively, are mostly bound by a stable connection, such as by a covalent bond. Such materials are further known under the expression hybrid polymers.

Known applications for the named materials comprise optical polymers, dish-washer stable coatings, dental materials or micro optics and microelectronics as well as scratch-resistant coatings, corrosion resistant coatings for metals, for food package applications and antireflective coatings, for example. Such applications are inter alia described in K. H. Haas, K. Rose, Hybrid inorganicdorganic polymer with nanoscale building blocks, Rev. Ad. Mater. Sci. 5 (2003) 47-52, as well as in K. H. Haas, S. Amberg-Schwab, K. Rose, Functionalized coating materials based on inorganic-organic polymers. Thin solid films 351 (1999) 198-203S.

The advantage of such inorganic-organic composite materials may inter alia be seen in the fact that such hybrid polymers show a synergistic effect between inorganic and organic phases which show properties which are not achievable by the respective inorganic or organic phases alone or by classical composite materials. Further, the respective structural units may be formed in the nanometer range which allows to use such coatings in a nanometer scale and thus to provide coatings having respective thicknesses.

Such materials can be tuned to fit a large range of properties and applications depending on the chosen precursors. A major advantage of such materials may further be seen in the fact that they are applied at low temperatures in efficient and low-cost wet-chemical coating methods, such as dip-coating, spraying, roller coating, ink-jet, screen printing. It is thus possible to eliminate vacuum processes.

Depending on the exact groups provided in such materials, the passivating coating can be cross-linked with UV-light or at moderate temperatures, such as even below 170° C., or even below 80° C., potentially by using a hardener. The inorganic-organic composite materials have excellent adhesions to silicon and further materials which may be used for forming the substrate and they are typically thermally stable up to 300° C. Furthermore, inorganic-organic composite materials may be resistant to acids, and may have high dielectric strength, such as in the range of 100 to 400 V/μm. The electric resistivity can be adjusted from insulating ($10^{16}$ Ohm*cm) down to conducting ($10^3$ Ohm*cm).

Regarding the inorganic-organic composite material, it may be advantageous to use an inorganic-organic polymer, or, alternatively or additionally, organic-inorganic polymer.

An inorganic organic polymer according to the present invention shall particularly be understood as polymeric materials which comprises inorganic elements in a main chain or network and which comprises organic side groups which are connected to the respective inorganic main chain, or network. The polymeric material may be cross-linked. The cross-linking and/or polymerization may thereby be realized by using the organic side groups especially in case they bare respective cross-linkable functional groups in their molecular structure. Further, such materials may be formed by firstly forming the inorganic backbone, e.g. by sol-gel processing subsequently to which organic polymerization may follow and the respective organic polymer may be cross-linked.

Further, an organic-inorganic polymer may be used for the passivating coating. Such polymers comprise an organic main chain, or network or backbone, respectively, and may contain inorganic elements as side groups or in the side groups. Again, cross-linking of these compounds may be advantageous, wherein cross-linking may be realized by using the inorganic side groups, for example. Advantageous examples for organic-inorganic polymers comprise inter alia the compounds which are commercially available under the name ceramer. Such materials are based e.g. on silylated organic oligomers or polymers with subsequent hydrolysis and polycondensation. Such materials may be prepared by sol-gel processing of silylated oligomers/polymers, wherein the organic network may be previously formed in the precursor molecule.

Additionally or alternatively to the above described inorganic-organic composite materials, the passivating coating may comprise or may consist of parylene. Parylene is the generic name for poly(p-xylylene) polymers, including multiple variations of the material. Parylenes may be chemical vapour deposited, ultra-thin, such as in the range of 50 nm to over 100 μm for providing conformal coatings. Apart from that, coatings formed from parylene may be completely uniform and pinhole-free. These polymer coatings provide an excellent moisture resistance as a moisture vapour transmission in a range of $\geq 0.1$ to $\leq 0.6$ (mm×g)/(m²×day). Apart from that, the chemical resistance may be very good as such coatings may be absolutely resistant to all solvents, acids, and bases at least at room temperature. Regarding the dielectric barrier properties, a dielectric strength in the range of $\geq 210$ to $\leq 280$ kV/mm may be reached. Further, a good thermal and UV stability is provided. Therefore, the properties of parylene are very well suited for providing a passivating coating for a power semiconductor device according to the invention.

Regarding the specific arrangement of the parylene polymer, different types of parylenes offer slightly different coating properties. With this regard, N, C, D, and F variations are in principle known in the art. In particular, fluorinated parylenes (F-variations) may be preferred as they are especially high temperature resistant, such as in short-term impacts, up to 450° C. Further, the lowest dielectric constant such as of approximately 2.25 of all parylenes may be reached by providing fluorinated parylenes.

Generally, the deposition of parylenes may be realized from a solid dimer powder, heated in a low vacuum until it sublimes. The gaseous dimer then passes through a pyrolysis area where it breaks into three reactive monomers. In the deposition chamber, at room temperature, the monomers are adsorbed on all exposed surfaces and polymerise to form the uniform parylene film. It conforms perfectly to even the most complex shapes with a constant thickness and perfect conformability, making especially parylene F a superb material for passivating coatings of junction terminations of power semiconductor devices according to the invention.

Thus, in particular, the following features of parylenes and especially of parylene F have a great advantage over other materials for the passivation of junction terminations at junction terminations: The deposition process may take place at room temperature, without solvents or other additives which allows gentle conditions. The deposition chambers further are batch compatible which allows a coating of multiple pieces and thus a highly economic production process. Further, deposition is possible from a vapour-phase, which allows conformal coating of even complex shapes, wherein shadow-masking of the areas which are not to be coated is possible without problems. Apart from that, no cross-contamination with the substrate material is to be expected which shows a high compatibility to semiconductor processes.

Thus, a coating comprising parylene is very well suited for coating surfaces having junction terminations of power semiconductor devices. Further, compared to the prior art, the passivating coating and thus parylene has totally a different function in the prior art as described above. In detail, the prior art discloses if at all a mechanical protection. An electrical function of surface passivation is not described and in no way rendered obvious for junction termination such as in particular edge termination surface passivation.

With regard to phenol resins comprising polymeric particles, such as rubber particles, the latter may for example be the one which is commercially available from the firm JSR Micro, Inc. under the name WPR. Such materials are a series of phenol resins with rubber particles. Such materials generally are reliable insulation materials with low thermal shrink, low residual stress, and chemical resistance. Further, such materials provide excellent heat resistance, such as up to 350° C., and further a high dielectric strength, such as 380 kV/mm. These materials can be photosensitive. Apart from that and with regard to application techniques, such materials may be applied by spin-coating, dip-coating, or spray-coating, which provide an easy and economic manufacturing process. The passivating coating if such phenol resins can be cross-linked with UV-light or by applying elevated temperatures, wherein, however, moderate temperatures such as in the range of below 200° C. may be sufficient.

A major advantage of such resins is thus their low curing temperature which allows gentle conditions and ease of processing and lower process costs, especially when compared to materials of a similar kind and with comparable properties regarding the dielectric constant, dielectric strength, and heat resistance, such as compared to polyimides as known in the prior art.

To summarize and with regard to the materials for applying the passivating coating of surfaces having junction terminations power semiconductor devices as described above, the following advantages may be reached.

In particular with regard to silicon based substrates and thus silicon based power semiconductor devices, a strong leakage current increase for high-temperature operation such as far above 125° due to temperature-driven conduction mechanisms becomes possible. Apart from that, rather complex and expensive PECVD deposition processes with limited process stability may under circumstances be avoided. Furthermore, even comparably large thicknesses for the passivating coating becomes possible. This may prevent that, such as by PECVD processes for materials according to the prior art, only thin sub-micrometer passivation layers thicknesses are possible resulting into issues of step coverage.

Accordingly, it becomes possible that no further coating, or layer, respectively may be required but depending on the respective characteristics of the coating, such as thickness and electrical properties, the passivating coating may be the only coating which is formed on the junction termination. In other words, coatings or stacks of coatings for the junction termination may be replaced by the present passivating coating.

Especially with regard to BIMOS devices, cracks in ceramic layers such as in silicon nitride (SiN) can be avoided in case the device is positioned in a module. Further, delamination and defects such as bubbles in polyimide top layers such as for BiMOS devices, or Silicone rubber interface to DLC, such as for Bipolar devices, may be avoided. With regard to wide bandgap (WBG) devices, a significant issue which mainly all such devices share is that due to the higher device internal electric field, also the field stress in the passivation stack and at the chip surfaces is higher. Any contamination in the form of particles and mobile ions, and any material defect like pinholes or cracks in the passivation layers, any possible electrochemical driven corrosion processes due to moisture, and any delamination, bubbles or insufficient adhesion of former passivating coating materials becomes extremely critical at such high surface field strengths. Besides the need for an excellent passivation directly on the device, there is also the need for field grading into the encapsulation of the device in order to avoid surface discharges and sparking at the device/encapsulation interface. These issues may be addressed by forming a power semiconductor device as described before.

Especially with regard to substrate passivation, an issue of ceramic substrates used in power modules is electrochemical migration that can lead to the formation of dendrites bridging metallized areas on different potential. Migrating species are typically silver ions that might originate for example from the braze layer of AMB metallized ceramic substrates. In addition, when considering novel silicon carbide power semiconductors with ultra-high blocking voltages such as over 10 kV, the effects of partial discharges, insulation breakdown, dendritic growth under humidity, etc. triggered by field enhancements of metallic parts at high voltage potential are getting very critical to the passivating coating of the power semiconductor device. Providing a device as described above, however, may address these issues.

It is thus the advantage of the present invention to apply the above-named materials for power semiconductor passivation and substrates junction termination insulation, such as substrate edge insulation. In particular the following applications may be envisaged: Firstly, low-voltage device passivation for Bipolar low-cost segment to replace inter alia DLC for electrically less demanding edge termination designs. Secondly, comparably thick ion protection layer and charge drainage coatings on top of already existing edge termination stacks resulting in robust passivation by additional coating or replacement of polyimide. This allows avoiding external ion migration and charge accumulation in the vicinity of the junction termination. Further, the passivating coating can be placed directly on top of the junction termination. Therefore, it is possible not only to replace polyimide layers but the whole stack of SIPOS-SiN-polyimide, which is known to be applied e.g. in case of BiMOS devices. In case of bipolar we are using only a stack of DLC-silicone rubber.

Apart from that, dispensable coatings may be realized for field grading of package parts on HV potential.

In particular, coatings of junction terminations such as substrate edges further comprising metallization coating may be realized in order to avoid surface discharges and dendritic growth. For these applications coatings are required that have stability up to 300° C., good barrier properties against mobile ions & humidity, high dielectric strength and tuneable resistivity for resistive field grading, excellent adhesion and thermomechanical cycle life to semiconductor and package parts to be protected, manufacturability in a cost-efficient and reproducible way, stable electrical properties for high-T operation of particularly significantly more than 125° C., and large thicknesses of more than 10 µm to shift the passivation/encapsulation interface towards lower electric fields.

These issues may be addresses by power semiconductor devices as described before.

With regard to the surface having the junction termination, it may be provided that at least one of the first side and the second side comprises an edge region being shaped in a beveled manner, or angled manner, respectively, wherein the beveled edge comprises the junction termination. This shaping increases the distance over which the electric potential is distributed hereby reducing the surface electric field and may thus be an improved embodiment.

In other words, a principal blocking junction of the device may terminate at a bevelled or angled surface of the substrate, such as silicon disc, at its outer periphery.

With regard to the beveled edges, it may be provided that at least one beveled edge region is at least partly coated by the passivating coating, particularly directly on the substrate material, wherein the passivating coating is formed, or comprises, respectively, one of the before-named materials.

Alternatively to the one or more bevelled edges, it may be provided that the surface having the junction termination comprises or is part of a guard ring (GR), comprises lateral doping (VLD) or is formed with a moat, like it is generally known in the art.

With regard to guard rings, such rings may be of p-type and may mainly prevent a respective depletion layer to merge with a depletion layer of the reverse-biased p-n-junction. The guard rings prevent the radius of the curvature of the depletion layer boundary to become too narrow which increases the breakdown strength. Coating respective junction terminations with the materials as described before at surfaces of guard rings as well may lead to at least one of the before-described advantages.

Referring to lateral doping, or variations in lateral doping (VLD), respectively, it may be provided that the surface having the junction termination is laterally doped. This as well is a measure which may significantly reduce the danger of damages of power semiconductor devices at junction terminations. Variation of lateral doping may mean, for example, that the p-doped region, for example, has gradually decreasing doping towards the p/n-junction. Again, coating respective junction terminations with the materials as described before at surfaces of laterally doped surfaces as well may lead to at least one of the before-described advantages.

A moat structure, such as a moat etch junction termination, may lead to the advantage that the electric field at the junction termination may be lowered, comparable to a beveled edge. Again, coating respective junction terminations with the materials as described before at surfaces of moat structures as well may lead to at least one of the before-described advantages.

According to a further embodiment, the coating is at least partly embedded in an encapsulation material. In other words, the beveled edges are not only coated by a passivating coating comprising or consisting of one or more of the before-named materials, but a further protection is provided in the form of an encapsulation material. The encapsulating material is thus provided on the coating and thus at least partly encapsulates it. Preferably, the encapsulation material fully covers the passivating coating so that the passivating coating is not exposed to the free volume surrounding the power semiconductor device. Such a further encapsulation material may allow one or more of the effects as described above with regard to the passivating coating to be especially effective. Apart from that, the encapsulation material may protect the passivating coating as such so that it is prevented that the passivating coating is damaged e.g. during the production process of a power semiconductor module comprising such a power semiconductor device. Thus, next to good electrical properties and thus a good working behavior of the power semiconductor device, the long term stability and reliability of the power semiconductor device and thus a power semiconductor module comprising such a power semiconductor device may further be enhanced.

With regard to the encapsulation material, it may be preferred that the latter comprises a rubber material. Especially a rubber material may further improve the electrical properties of the power semiconductor device. Apart from that, a rubber material is cost saving to provide and may further be provided on top of the passivating coating in an especially easy manner. Still further, a rubber material is a very efficient mechanical protection, so that the danger of a damage of the passivating material may be reduced especially effectively and thus the reliability of the power semiconductor device and thus of a power semiconductor module comprising such a power semiconductor device may be especially high.

According to a further embodiment, the passivating coating is located on a further coating. In other words, the passivating coating may be a second coating which is provided on a first coating, wherein the first coating is applied particularly directly on the substrate. Again, this embodiment provides an especially reliable and effective measure in order to mechanically protect the junction termination regions. Further, the electrical properties may be adapted especially effectively. The first coating may be formed from polyimide, for example.

According to a further embodiment, the substrate is shaped disc-like or rectangular. This embodiment allows using the power semiconductor device in conventional applications and in particular to replace such devices, which have a passivating coating formed from polyimide, or diamond like carbon, for example as such devices often have a substrate in a disc-like shape or rectangular or generally any further suitable form.

According to a further embodiment, both the first side and the second side comprise an edge region, the edge region being shaped in a beveled manner, wherein the beveled edge region comprises a p/n-junction. With this regard, the above named advantages apply both for the first and the second side and thus for the whole device, which makes the above-named advantages especially effective.

With regard to the possible solutions comprising positive and negative bevels, the same applies as described before with regard to the first side. In fact, it may be provided that at least one of the first and the second side comprises a positive bevel, a negative bevel or both a positive bevel and a negative bevel. Thus, a plurality of possible solutions may apply, the person skilled in the art may choose from according to the specific requirements. In detail the following solutions may preferably apply: single side single negative bevel, single side single positive bevel, single side double negative bevel, single side double positive bevel, double side single negative bevel, double side single positive bevel, double side double negative bevel, double side double positive bevel and single side or double side combined negative and positive bevel.

According to a further embodiment, the power semiconductor device is a device selected from the group consisting of Metal Oxide Semiconductor Field-Effect Transistors (MOSFET), Insulated Gate Bipolar Transistors (IGBT), Bi-Mode Insulated Gate Transistor (BIGT), or a Reverse Conductive IGBT (RC IGBT), diodes, thyristors, gate turn-off thyristors (GTOs) and gate controlled thyristors (GCTs) and BIMOS devices. It has been found that a coating of junction terminations may provide the before-named advantages especially effectively in case they are provided in one of the before-named devices.

According to a further embodiment, the passivating coating has a thickness in the range of $\geq 0.3$ µm to $\leq 1000$ µm, such as in the range of a $\geq 1$ µm to $\leq 500$ µm. Such thicknesses are comparably easy to prepare by known processes and thus allow a cost-saving application of the passivating coating. Apart from that, such a thickness of a coating having the materials as described above may provide a secure mechanical as well as electrical protection. However, the above-named thicknesses, especially at the upper range, are not possible at least with some materials known for protections coatings from the prior art. Therefore, it might as well be advantageous if the coating has a thickness of a $\geq 250$ µm, in particular of a $\geq 350$ µm, wherein the above named upper borders may as well apply. This allows to avoid too low thicknesses of overall passivation stack and thus preventing high E-field at the passivation interface.

A device as described above thus addresses issues of at least one of passivation and thus prevents or at least reduces the danger of fatal defects such as unstable device operation caused by changes in film properties, instability, water permeability, permeability of movable ions such as sodium, pinholes and cracks, and aluminum metal disconnection or corrosion due to degradation and stress. These negative influences may be prevented or at least significantly reduced.

With regard to further advantaged and technical features of the before-described power semiconductor device it is referred to the description of the power semiconductor module, the method, the figures as well as the description of the figures.

The present invention further relates to a power semiconductor module, comprising at least one power semiconductor device as described in detail before.

The power semiconductor module may thus comprise one or more of the before-described power semiconductor devices, wherein such devices are located on a substrate, or substrate metallization, respectively. The general setup of a power semiconductor module may be realized as it is generally known in the art.

For example, the power semiconductor module may comprises a housing in which at least one power semiconductor device is arranged. The power semiconductor device may in a preferred example be a Metal Oxide Semiconductor Field-Effect Transistor (MOSFET), an Insulated Gate Bipolar Transistor (IGBT), a Bi-Mode Insulated Gate Transistor (BIGT), or a Reverse Conductive IGBT (RC IGBT), or the like and it may be formed as described in detail above. In an embodiment, a diode and an IGBT are provided as power semiconductor devices. The power semiconductor device or the plurality of semiconductor devices are connectable via contact terminals, or contact elements, respectively, and preferably via an auxiliary terminal. In detail, the contact elements may serve as an emitter terminal and as a collector terminal, whereas the auxiliary terminal may serve as a gate. The power semiconductor device or the plurality of semiconductor devices is preferably bonded by aluminium bond wire.

The power semiconductor device may further be arranged on a substrate, or wafer, respectively, which may be formed of a ceramic insulator, in particular of an aluminium nitride ceramic insulator. In detail, the contact elements as well as the auxiliary terminal are connected to a conductor, such as a metallization, provided on the substrate, in particular a copper metallization. The conductor, or the metallisation, may be formed as a structure being appropriate for the desired application. Electrically connected to the conductor via a solder, for example, is in turn the power semiconductor device. Additionally, the substrate is connected at its bottom side to a base plate via a further conductor, in particular a copper metallization, and via a solder. The remaining volume inside the housing is filled e.g. with a silicone gel.

In order to connect the power semiconductor arrangement to an electrical circuit, the contact elements can be guided to the outside of the housing of the power semiconductor arrangement. In an alternative embodiment, the contact element is electrically connected to a power terminal of the power semiconductor arrangement for connecting the power semiconductor arrangement to an electrical circuit.

A module as described above thus addresses issues of passivation of junction terminations of semiconductor devices and thus prevents or at least reduces the danger at least one of fatal defects such as unstable device operation caused by changes in film properties, instability, water permeability, permeability of movable ions such as sodium, pinholes and cracks, and aluminum metal disconnection or corrosion due to degradation and stress.

With regard to further advantaged and technical features of the before-described power semiconductor module it is referred to the description of the power semiconductor device, the method, the figures as well as the description of the figures.

The present invention further relates to a method of producing a power semiconductor device, the method comprising the steps of:
a) providing a semiconductor substrate having at least one surface with a junction termination of a p/n-junction; and
b) coating the junction termination with a material selected from the group consisting of an inorganic-organic composite material, parylene, and a phenol resin comprising polymeric particles.

Such a method provides a power semiconductor device addressing issues of at least one of passivation of junction termination of semiconductor modules and thus prevents or at least reduces the danger of fatal defects such as unstable device operation caused by changes in film properties, instability, water permeability, permeability of movable ions such as sodium, pinholes and cracks, and aluminum metal disconnection or corrosion due to degradation and stress.

The semiconductor substrate having at least one surface with a junction termination comprising a p/n-junction may generally be provided as it is known in the art. In fact, silicon wafers may be subject to different processes, such as an implantation process, a diffusion process, a photolithographic process and a metallization process, subsequent to which the silicon wafers are formed such as cut to circular discs, and a first or upper bevel and a second or lower bevel may for example be ground on the high-voltage blocking p/n-junction(s).

With regard to step b), at least a part of the edge region is coated with a material selected from the group consisting of an inorganic-organic composite material, parylene, and a phenol resin comprising polymeric particles. The respective coating process may be dependent from the specific coating material as it is described in detail above with regard to the description of the coating materials.

With regard to further advantaged and technical features of the before-described power semiconductor module it is referred to the description of the power semiconductor element, the method, the figures as well as the description of the figures

BRIEF DESCRIPTION OF DRAWINGS

Additional features, characteristics and advantages of the subject-matter of the invention are disclosed in the sub-claims, the figures and the following description of the respective figures and examples, which—in an exemplary fashion—show embodiments according to the invention.

In the figures.

DESCRIPTION OF EMBODIMENTS

Figure 1:
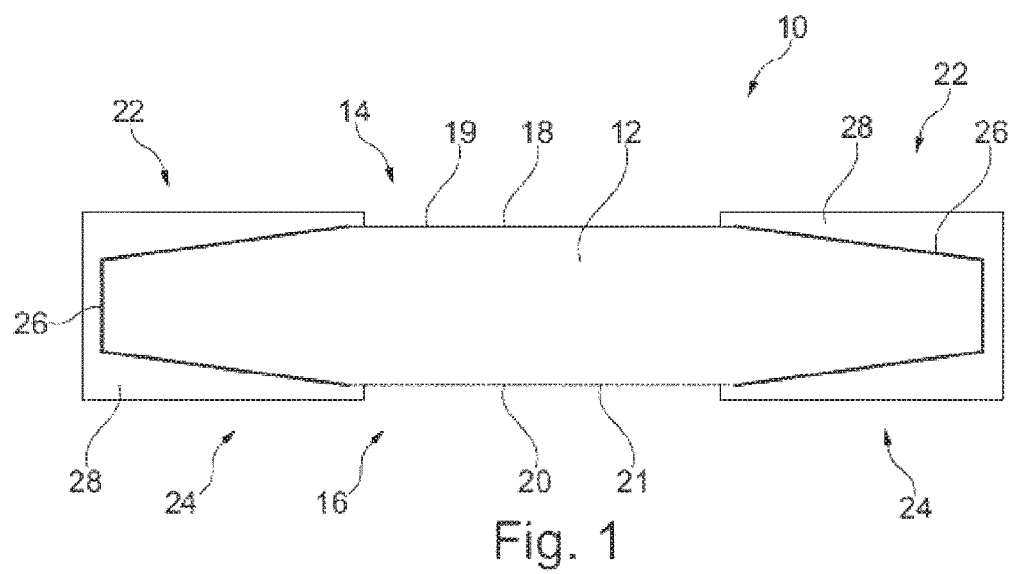
FIG. 1 shows a schematic view of a power semiconductor device according to the invention.

In FIG. 1, a schematic view of a power semiconductor device 10 according to an embodiment of the present invention is shown. The power semiconductor device 10 comprises a disc-shaped substrate 12 having a first side 14 and a second side 16, the first side 14 and the second side 16 being located opposite to each other. The first side 14 comprises a cathode 18 and the second side 16 comprises an anode 20, both the cathode 18 and the anode 20 being formed from a metallic contact 19, 21. Both of the first side 14 and the second side 16 comprises an edge region 22, 24, the edge region 22, 24 being shaped in a beveled manner, wherein the beveled edge region 22, 24 comprises a p-n-junction, not illustrated as such. The beveled edge regions 22, 24 are at least partly coated by a passivating coating 26, the passivating coating 26 comprising at least one material selected from the group consisting of an inorganic-organic composite material, parylene, and a phenol resin comprising polymeric particles. In detail respective negative bevels are respectively coated.

It can further be seen that the passivating coating 26 is at least partly embedded in an encapsulation material 28 formed from rubber.

FIG. 1 further shows that the passivating coating 26, or passivation layers, respectively, is applied by masking the electrode regions in order to protect them so that the passivating coating 26 is only applied to the open silicon surface with a small overlap to metallization, such as aluminum metallization. This may be realized independent of the specific embodiment of the power semiconductor device.

Such devices 10 as shown in FIG. 1 were then tested electrically by using respective thyristors for their blocking capability. In detail, reverse and forward blocking curve current vs. voltage of a thyristor is determined, wherein the edge termination was coated with inorganio-organic polymer coating, Parylene F and WPR 5100. In case of all used materials, the device is able to block up to about 2.6 kV, with a leakage current <15 µA like it can be seen in FIG. 2.

Further, the dielectric on the other side are coated on the edge regions 22, 24 and in detail on negative bevels of a bipolar thyristor device. Such devices as well were electronically tested as can be seen in FIG. 3.

In detail, the following devices 10 were tested by determining reverse and forward blocking curves of respective thyristors: silicone rubber (curve A), Parylene-F (curve B), WPR (curve C), Parylene-F having silicone rubber on top as encapsulation material (curve D), WPR having silicone rubber on top as encapsulation material (curve E) and inorganic-organic polymer (curve F).

Figure 2:
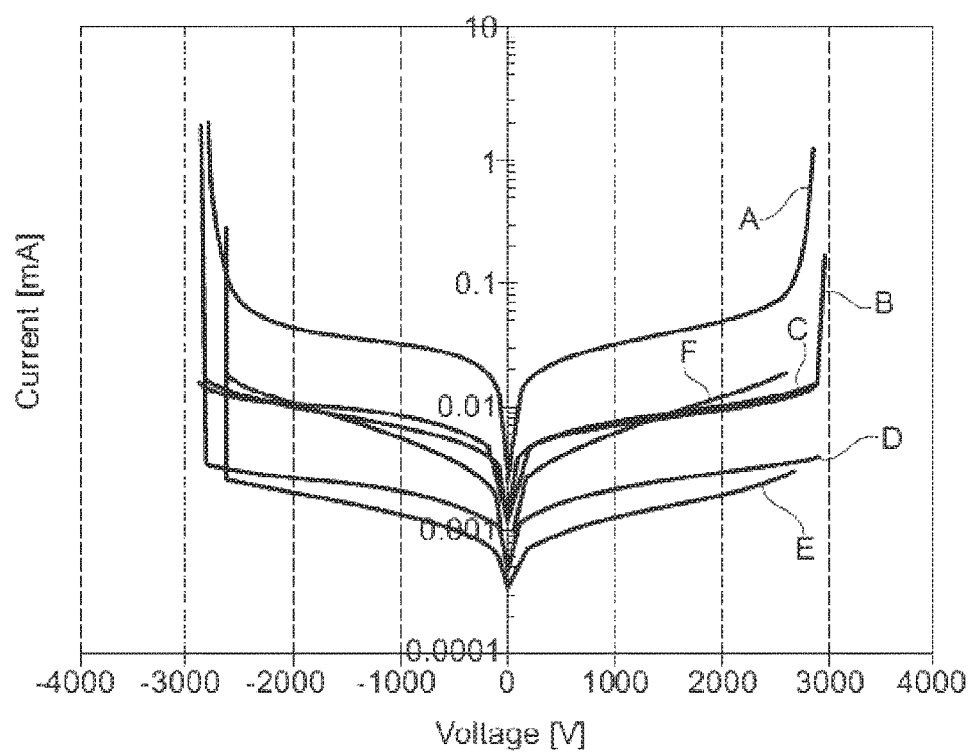
FIG. 2 shows a reverse and forward blocking curve for an exemplarily embodiment of the invention.

FIG. 2 shows the forward and reverse blocking curves of the devices 10 when passivated with the respective materials as described above. The device is able to block up to about 2.9 kV, with a leakage current ~50 mA in case passivated only with silicone rubber. When the device is passivated with Parylene or WPR the leakage current decreases about 1 order of magnitude. It is to observe that upon additional rubber encapsulation of Parylene and WPR, the leakage current decreases further about 1 order of magnitude (2 order of magnitude when compared to pure silicone rubber passivation). It can be seen that the thin polymeric layer of Parylene or WPR effectively passivates the surface of the wafer at the bevel, acting together with the rubber, which further suppresses high electrical field appearing near the surface.

Further, it can be seen that inorganic-organic polymer as well has efficient properties with regard to a protection coating.

With regard to silicone rubber only (curve A) as reference, all used materials according to the present invention are much (equally) better than the silicone rubber alone.

It is clear to those skilled in the art that the same technology can be used for the passivation of diodes, transistors and other semiconductor devices having the same or similar junction terminations and is not limited to the circular shape, i.e. it can be also of rectangular shape.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SIGNS LIST 10 power semiconductor device
12 substrate
14 first side
16 second side
18 cathode
19 metallic contact
20 anode
21 metallic contact
22 edge region
24 edge region
26 passivating coating
28 encapsulation material

The invention claimed is:

1. A power semiconductor device, comprising
a substrate having a first side and a second side, the first side and the second side being located opposite to each other, wherein the first side comprises a cathode and the second side comprises an anode, wherein a junction termination of a p/n-junction is provided at at least one surface of the substrate, at least one of the first side and the second side, characterized in that the junction termination is coated by a passivating coating, the passivating coating comprising a material consisting of an organic-inorganic polymer.

2. A power semiconductor device, comprising a substrate having a first side and a second side, the first side and the second side being located opposite to each other, wherein the first side comprises a cathode and the second side comprises an anode, wherein a junction termination of a p/n-junction is provided at at least one surface of the substrate, at least one of the first side and the second side, characterized in that the junction termination is coated by a passivating coating, the passivating coating comprising a material consisting of a parylene.

3. A power semiconductor device, comprising a substrate having a first side and a second side, the first side and the second side being located opposite to each other, wherein the first side comprises a cathode and the second side comprises an anode, wherein a junction termination of a p/n-junction is provided at at least one surface of the substrate, at least one of the first side and the second side, characterized in that the junction termination is coated by a passivating coating, the passivating coating comprising a material consisting of a phenol resin comprising polymeric particles.

4. The power semiconductor device according to claim 2, wherein the parylene is parylene F.

5. The power semiconductor device according to claim 3, wherein the phenol resin comprises rubber particles.

6. The power semiconductor device according to claim 1, wherein the passivating coating is at least partly embedded in an encapsulation material.

7. The power semiconductor device according to claim 6, wherein the encapsulation material comprises a rubber material.

8. The power semiconductor device according to claim 1, wherein the passivating coating is located on a further coating.

9. The power semiconductor device according to claim 2, wherein the passivating coating is at least partly embedded in an encapsulation material.

10. The power semiconductor device according to claim 9, wherein the encapsulation material comprises a rubber material.

11. The power semiconductor device according to claim 3, wherein the passivating coating is at least partly embedded in an encapsulation material.

12. The power semiconductor device according to claim 11, wherein the encapsulation material comprises a rubber material.

13. The power semiconductor device according to claim 2, wherein the passivating coating is located on a further coating.

14. The power semiconductor device according to claim 3, wherein the passivating coating is located on a further coating.

15. The power semiconductor device according to claim 4, wherein the passivating coating is located on a further coating.

16. The power semiconductor device according to claim 5, wherein the passivating coating is located on a further coating.

17. The power semiconductor device according to claim 6, wherein the passivating coating is located on a further coating.

18. The power semiconductor device according to claim 7, wherein the passivating coating is located on a further coating.

19. The power semiconductor device according to claim 8, wherein the passivating coating is located on a further coating.

20. The power semiconductor device according to claim 9, wherein the passivating coating is located on a further coating.

* * * * *